United States Patent [19]

Watanabe et al.

[11] Patent Number: 5,085,712

[45] Date of Patent: Feb. 4, 1992

[54] IRON/COPPER/CHROMIUM ALLOY MATERIAL FOR HIGH-STRENGTH LEAD FRAME OR PIN GRID ARRAY

[75] Inventors: Kunio Watanabe; Satoshi Nishimura, both of Sagamihara; Kunishige Kaneko, Tokyo, all of Japan

[73] Assignee: Nippon Steel Corporation, Tokyo, Japan

[21] Appl. No.: 527,710

[22] Filed: May 23, 1990

Related U.S. Application Data

[60] Continuation of Ser. No. 385,351, Jul. 27, 1989, abandoned, which is a division of Ser. No. 198,496, May 25, 1988, Pat. No. 4,869,758.

[30] Foreign Application Priority Data

May 26, 1987 [JP] Japan .................................. 62-127193
Jul. 7, 1987 [JP] Japan .................................. 62-167902

[51] Int. Cl.$^5$ .................................................. C22D 1/08
[52] U.S. Cl. .................................. 148/2; 148/12.7 C; 148/12.7 R; 148/326; 148/328; 148/411; 148/414; 148/413; 420/495; 420/582
[58] Field of Search ............... 148/2, 12.7 C, 12.7 R, 148/326, 328, 411, 413, 414; 420/495, 582

[56] References Cited

U.S. PATENT DOCUMENTS

| 2,210,314 | 8/1940 | Wright | 420/495 |
| 2,254,944 | 9/1941 | Hensel et al. | 148/411 |
| 3,574,001 | 4/1971 | Ence | 148/411 |
| 4,049,426 | 9/1977 | Watson et al. | 75/153 |
| 4,067,750 | 1/1978 | Mravie et al. | 148/2 |
| 4,439,247 | 3/1984 | Arita et al. | 148/12.7 C |
| 4,640,723 | 2/1987 | Sugai et al. | 148/411 |

FOREIGN PATENT DOCUMENTS

| 23362 | 2/1981 | European Pat. Off. . | |
| 114338 | 8/1984 | European Pat. Off. . | |
| 49-91025 | 8/1974 | Japan . | |
| 50-123011 | 9/1975 | Japan . | |
| 2177160 | 8/1987 | Japan | 148/2 |

OTHER PUBLICATIONS

Chemical Abstracts, vol. 82, No. 20, 128427e (1975).
Chemical Abstracts, vol. 84, No. 14, 84:94307q (1976).

*Primary Examiner*—Olik Chaudhuri
*Assistant Examiner*—Felisa Garrett
*Attorney, Agent, or Firm*—Wenderoth, Lind & Ponack

[57] ABSTRACT

An iron/copper/chromium alloy material for a high-strength lead frame or pin grid array, which comprises 20 to 90% by weight of Cu and 2.5 to 12% by weight of Cr, with the balance being mainly iron, and which has an average grain size number of at least 10 in each of the iron/chromium phase and the copper phase, is prepared by continuous casting, cold-working, and aging.

7 Claims, No Drawings

IRON/COPPER/CHROMIUM ALLOY MATERIAL FOR HIGH-STRENGTH LEAD FRAME OR PIN GRID ARRAY

This application is a continuation of now abandoned application Ser. No. 07/385,351 filed on July 27, 1989, which is a division of Ser. No. 07/198,496 filed on May 25, 1988, now U.S. Pat. No. 4,869,758.

BACKGROUND OF THE INVENTION (1) Field of the Invention

The present invention relates to an iron/copper/chromium alloy material for a high-strength lead frame of a semiconductor IC and LSI or for a pin grid array, which has an excellent heat conductivity and electric conductivity and is produced at a low cost, and a process for the preparation thereof.

(2) Description of the Related Art

An iron alloy (Kovar alloy) containing 26 to 30% by weight of nickel and 11 to 16% by weight of cobalt, disclosed in Japanese Unexamined Patent Publication No. 59-198741, and an iron alloy containing 30 to 55% by weight of nickel (42% Ni alloy is a typical composition) disclosed in Japanese Unexamined Patent Publication No. 60-111447, are used as a lead frame material for semiconductor IC's or LSI's, because these alloys are compatible with a glass sealing material or Si with regard to the thermal expansion characteristics thereof. Furthermore, copper and copper alloys have gradually come to be used for IC's where a high heat conductivity and electric conductivity are required.

Namely, the above-mentioned Kovar alloy or 42Ni alloy has an excellent strength and heat resistance, but a poor heat conductivity, electric conductivity and processability, and a high cost. Accordingly, to cope with the recently increasing requirements for a heat-radiating property, which are due to the increase of the integration degree of IC's, a cheap copper alloy having an excellent heat conductivity, electric conductivity, and processability is used instead of the above-mentioned alloys.

Since an iron/copper alloy has an excellent electric conductivity and abrasion resistance, the alloy is often used for a sliding contact element or the like, and a copper/iron/chromium alloy in which the poor corrosion resistance of the iron/copper alloy is strengthened by an incorporation of chromium is known, as disclosed in Japanese Unexamined Patent Publication No. 49-91025.

In general, copper alloys have a poor heat resistance and strength, and accordingly, these defects are eliminated by an addition of tin, iron, silicon, phosphorus, and cobalt, as, for example, in the CA-195 alloy and an alloy disclosed in Japanese Unexamined Patent Publication No. 60-218442. The cost, however, is increased by the addition of these elements, and further, the heat conductivity and electric conductivity are reduced thereby.

Moreover, the iron/copper/chromium alloy is defective in that the alloy is separated into an iron/chromium phase and a copper phase, which have greatly different surface characteristics such as soldering and plating properties.

SUMMARY OF THE INVENTION

A primary object of the present invention is to provide an iron/copper/chromium alloy material for a high-strength lead frame or pin grid array, in which the corrosion resistance, which is important in the preparation process or upon deterioration of the operating environment, is improved by an incorporation of chromium in an alloy comprising iron and copper as main constituent elements, and which has a satisfactory heat conductivity and electric conductivity, and the high strength required for a high-strength lead frame or pin grid array, and has an excellent processability.

The present inventors investigated the use of various alloys with a view to overcoming the above-mentioned defects of the conventional techniques and clarifying the conditions required for an iron/copper/chromium alloy having excellent properties as a material for an IC packaging lead frame or pin grid array, and as a result, found that the above problems can be solved by reducing the particle sizes in the iron/chromium phase and the copper phase. Based on this finding, the inventors have now completed the present invention, which provides an iron/copper/chromium alloy material for a high-strength lead frame or pin grid array.

More specifically, in accordance with the present invention, there is provided an iron/copper/chromium alloy material for a high-strength lead frame or pin grid array, which comprises 20 to 90% by weight of Cu and 2.5 to 12% by weight of Cr, with the balance being mainly iron, wherein each of the iron/chromium phase and the copper phase has an average grain size number of at least 10.

Furthermore, in accordance with the present invention, there is provided a process for the preparation of the above-mentioned alloy material, in which continuous casting conditions, cold-working conditions, and aging treatment conditions are specified so that the above-mentioned alloy material is obtained.

DESCRIPTION OF THE PREFERRED EMBODIMENTS

The structural requirements of the present invention will now be described.

The following explanation is mainly of the material for a lead frame, but the material of the present invention can be also used for a pin grid array.

The reasons for the limitations of the chemical composition of the material are first described.

A high copper content is preferred for improving the heat conductivity and electric conductivity, but where a high strength is required, an increase of the iron content is desired. If the copper content is lower than 20% by weight, the heat conductivity and electric conductivity necessary for an IC lead frame cannot be obtained, and therefore, the lower limit of the copper content is set at 20% by weight. If the content of iron and chromium is lower than 10% by weight, the amount and distribution of the iron/chromium-rich phase effective for making the texture finer are unsatisfactory, and the good combination of strength and electric conductivity as intended in the present invention cannot be obtained. Therefore, the upper limit of the copper content is set at 90% by weight.

The chromium is incorporated in an amount of at least 2.5% by weight to improve the corrosion resistance of the material, and if the amount of chromium is less than 2.5% by weight, this effect is not obtained. But, if the amount of chromium exceeds 12% by weight, the effect of improving the corrosion resistance is saturated and the soldering property is drastically degraded, and accordingly, the upper limit of the chromium content is set at 125 by weight. The amount of chromium necessary for improving the corrosion resistance of iron is ordinarily much larger than the above-mentioned lower limit, but in the present invention, since the iron content in the alloy is relatively low and the distribution of chromium in the iron is increased at the time of solidification, an excellent effect can be attained with the addition of only a small amount of chromium.

To improve the strength, processability, and plating property, preferably at least one element selected from the group consisting of Si, Al, Ti, Ni, Zn, Sn, Nb, Zr and P is incorporated. In this case, Al, Ti, Nb, Zr or P is incorporated in an amount of from 0.01% to 0.5% by weight; Zn or Si is incorporated in an amount of from 0.01% to 1% by weight; and Ni or Sn is incorporated in an amount of from 0.01% to 4% by weight. Other elements are impurity elements unavoidably incorporated from the starting materials or at the melting and subsequent steps.

The characteristic feature of the present invention is that the average grain size number of each of the iron/chromium phase and the copper phase is at least 10. The soldering property and plating property are greatly influenced by the grain size, and this grain size dependency is shown in Table 1. From the data shown in Table 1, it is obvious that he grain size number should be at least 10.

tained material for a high-strength lead frame has a texture in which the grain size number is at least 10.

In the above-mentioned cast piece, cracking readily occurs at cold working. As a means for preventing this cracking, a method can be adopted in which a gradual cooling within a certain temperature range is carried out just after casting, and re-heating is conducted after cooling to room temperature. More specifically, cooling is carried out at a cooling speed of 10° to 100° C./sec within a temperature range of 850° to 750° C., or a heat treatment is carried out at a temperature of 850° to 450° C. for 20 to 60 minutes. If the treatment condition is under the lower limit, a satisfactory cracking-preventing effect cannot be obtained, and if the treatment condition is above the upper limit, undesirable phenomena such as a coarsening of grains and a reduction of the degree of supersaturation attained by rapid cooling occur. This is due to the residual austenite or martensite formed during the cooling conducted after the casting or to a reduction of the difference of the hardness between the iron/chromium phase and the copper phase by temper softening.

Subsequently, cold-working and aging treatments are carried out. The main object of the cold-working is to obtain a size necessary for a lead frame, and the reduction ratio at the primary cold-working is selected according to the chemical composition, the size of the cast piece, and the conditions of the final cold-working, so

TABLE 1

| | Grain Size Number | Tensile Strength (kgf/mm$^2$) | Soldering Property wetting stress (g) | evaluation | Evaluation of Cu Plating |
|---|---|---|---|---|---|
| 44%Fe—50%Cu—6%Cr | 9.0 | 60 | 0.20 | bad | bad |
| " | 10.5 | 62 | 0.55 | good | good |
| " | 12.5 | 65 | 0.60 | good | good |
| Oxygen-free copper | — | 25 | 0.65 | good | — |

As the means for reducing the grain size, there can be mentioned a method in which cold rolling and annealing are carried out under atmospheric pressure, but this method is not preferred because the anisotropy in the plate plane of the material is increased. Therefore, in the present invention, the material is directly cast into a sheet, a rod or the like, by a twin-roll method or the like. This process is excellent as the means for reducing the grain size in the crystalline texture and is advantageous in that hot working of the iron/copper/chromium alloy having a poor hot workability can be omitted.

The preparation process will now be described in detail. At first, a thin cast piece of the iron/copper/chromium alloy is prepared by continuous casting. At this step, the primary cooling speed is limited to at least 100° C./sec. That is because, as the cooling speed at the time of solidification is high, the grain size of the solidified texture is generally reduced and this effect is retained even if a heat treatment or a cold-working/annealing treatment is ten performed. The lower limit of the cooling speed is set so that, even when copper is incorporated in an amount larger than 70% by weight and it is relatively difficult to obtain a high strength, a strength required for a material for a high-strength lead frame can be obtained. If the above-mentioned cooling speed is maintained, a solidified texture having a grain size number of at least 10 is obtained. Therefore, if this cast piece is then cold-worked and annealed, the obthat the intended size, strength, and workability can be obtained. IN general, the reduction ratio at the primary cold-working is preferably 30 to 95%.

The aging treatment must be carried out, to improve the heat conductivity and electric conductivity, and an appropriate temperature should be selected according to the chemical composition and the conditions of the preceding steps. In general, if the temperature is too low, distortion is generated around the precipitate, and the characteristics of the base material are degraded. Moreover, since the heating time becomes too long, limitations are imposed on the equipment and the production efficiency is reduced. If the temperature is too high, the amount of the precipitate is too small and good characteristics can not be obtained. Moreover, the precipitate is coarsened and it is difficult to maintain a required strength. Accordingly, preferably the aging treatment is carried out at 450° to 650° C. for 20 to 500 minutes.

If a good processability is especially required for a lead frame, prior to the aging treatment, annealing can be carried out at a temperature of 650° to 1050° C. for a practical time of 5 to 60 minutes, whereby the working strain introduced at the cold-working is removed and the processability is improved by recrystallization and a growth of grains.

The material of the present invention is suitable for use in fields wherein a strong lead frame is required. Where a good processability and a higher strength are required, cold-working is carried out at a reduction ratio of 15 to 60% after the above-mentioned annealing to introduce working strain, whereby the strength is increased. The lower limit of the reduction ratio for obtaining the desired effect is 15%, and the upper limit at which a substantial reduction of the processability, heat conductivity or electric conductivity will not occur, is 60%.

In the present invention, by appropriately combining the pickling, cold-rolling, and heat treatments, a stable copper-rich phase can be formed and the soldering and plating properties important for a lead frame material can be improved. Accordingly, an excellent material is provided in the present invention.

The shape of the material is not limited to a plate-like shape, but may be a circular cross-section or a rod-like shape.

The present invention will now be described in detail with reference to the following examples that by no means limit the scope of the invention.

and then the aging treatment was carried out at 500° C. for 150 minutes, followed by air cooling.

The corrosion resistance was evaluated based on the ratio (%) of rust spots observed after a salt water spray test (JIS Z-2371) had been conducted for 24 hours.

For comparison, the characteristic properties of Fe-Ni and Cu-Fe-Sn alloys are shown in Table 3.

Sample 1 is a comparison sample having a too low chromium content, and it is apparent that sample 1 has a poor corrosion resistance, when evaluated by the salt water spray test. It is also apparent that samples 3, 5, and 7 have a larger grain size than samples 2, 4, and 6 of the present invention having the same composition, and samples 3, 5, and 7 are inferior to samples 2, 4, and 6 of the present invention in tensile strength, electric conductivity, soldering property, and Cu-plating property. Accordingly, it is obvious that the samples of the present invention have superior characteristics.

TABLE 3

| Sample No. | Sample Alloy | | Grain Size Number (ASTM) | Tensile Strength (kgf/mm$^2$) | Total Elongation (%) | Electric Conductivity (IACS) | Salt Water Spray Test (%) | Soldering Property | | Evaluation Cu-Plating Property |
|---|---|---|---|---|---|---|---|---|---|---|
| | | | | | | | | of Wetting stress (g) | Evaluation | |
| 1 | A | comparison | 12.8 | 55 | 12 | 36 | 84 | 0.57 | good | good |
| 2 | B | present invention | 13.1 | 81 | 10 | 32 | 28 | 0.58 | good | good |
| 3 | B | comparison | 8.7 | 53 | 12 | 29 | 29 | 0.28 | bad | bad |
| 4 | C | present invention | 13.5 | 68 | 9 | 35 | 19 | 0.59 | good | good |
| 5 | C | comparison | 9.3 | 59 | 12 | 31 | 18 | 0.25 | bad | bad |
| 6 | D | present invention | 12.4 | 60 | 11 | 62 | 13 | 0.56 | good | good |
| 7 | D | comparison | 9.0 | 55 | 13 | 56 | 14 | 0.20 | bad | bad |
| 8 | E | present invention | 13.0 | 60 | 12 | 57 | 16 | 0.56 | good | good |
| 9 | F | present invention | 12.5 | 65 | 14 | 40 | 20 | 0.57 | good | good |
| Fe—42Ni | | comparison | — | 62 | 10 | 4 | 19 | 0.60 | good | good |
| Cu—0.1Fe—2.0Sn | | comparison | — | 55 | 12 | 35 | — | 0.62 | good | good |

EXAMPLE 1

The chemical compositions of comparative alloy A and alloys B and F of the present invention are shown in Table 2.

TABLE 2

| Sample Alloy | Chemical Composition (% by weight) | | | | | | |
|---|---|---|---|---|---|---|---|
| | Fe | Cu | Cr | C | Si | Al | Ti | Ni |
| A | balance | 54.3 | 0.71 | 0.0019 | — | — | — | — |
| B | " | 46.4 | 3.0 | 0.0024 | 0.54 | — | — | — |
| C | " | 41.6 | 5.9 | 0.0043 | — | 0.034 | — | — |
| D | " | 78.5 | 10.8 | 0.0032 | — | — | 0.043 | — |
| E | " | 65.7 | 4.8 | 0.0027 | — | — | — | 1.50 |
| F | " | 53.8 | 6.0 | 0.0036 | 0.28 | 0.240 | — | — |

The grain size numbers and material characteristics of iron/copper/chromium alloy thin strips prepared from the sample alloys shown in Table 2 are shown in Table 3.

A continuous casting of samples 1, 2, 4, 6, 8, and 9 was carried out at a cooling speed of 3.5×10$^{2°}$ C./sec by using a twin-roll casting machine, to a thickness of 1.8 mm, and then cooling was effected at a cooling speed of 20° C./sec within a temperature region of 850° to 750° C. in a heat reserving furnace. Cold-rolling was then conducted so that the final thickness was 0.25 mm,

EXAMPLE 2

The chemical compositions of comparative alloy G and alloys H through L of the present invention are shown in Table 4.

TABLE 4

| Sample Alloy | Chemical Composition (% by weight) | | | | | | |
|---|---|---|---|---|---|---|---|
| | Fe | Cu | Cr | C | Si | Al | Ti | Ni |
| G | balance | 52.9 | 0.52 | 0.0028 | — | — | — | — |
| H | " | 39.7 | 3.2 | 0.0017 | 0.036 | — | — | — |
| I | " | 42.6 | 6.7 | 0.0036 | — | 0.025 | — | — |
| J | " | 85.2 | 11.3 | 0.0017 | — | — | 0.073 | — |
| K | " | 68.1 | 4.6 | 0.0025 | — | — | — | 1.45 |
| L | " | 51.5 | 5.1 | 0.0049 | 0.044 | 0.138 | — | — |

The material properties of iron/copper/chromium alloy thin strips obtained by treating the alloys shown in Table 4 under the conditions described below are shown in Table 5.

A continuous casting was carried out at a cooling speed of 2.8×10$^{2°}$ C./sec by using a twin-roll casting machine, to a thickness of 2.0 mm. During the cooling, the sample was maintained at 850° C. for 30 minutes, to prevent cracking during the cold-rolling, and the sample was rolled at a reduction ratio of 85% so that the thickness was reduced to 0.3 mm. After the cold-rolling, the aging treatment was carried out at 500° C. for 150 minutes, followed by air cooling.

It is seen that sample 11 having a too low chromium content is inferior to other samples in corrosion resistance.

The corrosion resistance was evaluated based on the ratio (%) of rust spots observed after the salt water spray test (JIS Z-2371).

For comparison, the characteristics of Fe-Ni and Cu-Fe-Sn alloys are shown in Table 5.

From the results shown in Table 5, it is seen that the materials of the present invention have excellent characteristics.

TABLE 5

| Sample No. | Sample Alloy | | Grain Size Number (ASTM) | Tensile Strength (kgf/mm²) | Tensile Elongation (%) | Electric Conductivity (%) (IACS) | Salt Water Spray Test (%) | Soldering property Wetting stress (g) | Evaluation of Soldering Property | Evaluation of Cu-Plating Property |
|---|---|---|---|---|---|---|---|---|---|---|
| 10 | G | comparison | 12.0 | 56 | 11 | 32 | 86 | 0.59 | good | good |
| 11 | H | present invention | 13.0 | 63 | 9 | 31 | 30 | 0.57 | good | good |
| 12 | I | present invention | 13.2 | 68 | 8 | 35 | 18 | 0.58 | good | good |
| 13 | J | present invention | 12.2 | 58 | 11 | 63 | 12 | 0.59 | good | good |
| 14 | K | present invention | 12.3 | 61 | 12 | 56 | 17 | 0.58 | good | good |
| 15 | L | present invention | 12.5 | 64 | 13 | 41 | 21 | 0.57 | good | good |
| Fe—42Ni | | comparison | — | 62 | 10 | 4 | 19 | 0.60 | good | good |
| Cu—0.1Fe—2.0Sn | | " | — | 55 | 12 | 35 | — | 0.62 | good | good |

EXAMPLE 3

Sample alloy I having a composition within the scope of the present invention, which is shown in Table 4, was cast by a twin-roll casting machine at a cooling speed within the scope of the present invention and at a cooling speed outside the scope of the present invention, respectively. The treatment conditions after the casting operation were the same as in Example 2. The results are shown in Table 6. It can be seen that the cooling speed at the casting step has a remarkable influence.

TABLE 6

| | Sample 16 | Sample 12 |
|---|---|---|
| Cooling speed (°C./sec) at casting step | $3.8 \times 10^1$ | $2.8 \times 10^2$ |
| | comparison | present invention |
| Grain size number (ASTM) | 8.6 | 13.2 |
| Tensile strength (kgf/mm²) | 61 | 68 |
| Total elongation (%) | 6 | 8 |
| Electric conductivity (%) (IACS) | 25 | 35 |
| Soldering property | | |
| wetting stress (g) | 0.30 | 0.58 |
| evaluation | bad | good |
| Evaluation of Cu-plating property | bad | good |

EXAMPLE 4

A sample alloy H having a composition within the scope of the present invention, as shown in Table 4, was annealed or not annealed after the cold-rolling operation but before the aging treatment, to determine the effect of the annealing. The results are shown in Table 7. It can be seen that, if annealing is carried out before the aging treatment, the ductility and electric conductivity are improved.

TABLE 7

| | Sample 17 | Sample 11 |
|---|---|---|
| Annealing (°C. × minutes) before aging treatment | 750 × 30 | not performed |
| | present invention | present invention |
| Tensile strength (kgf/mm²) | 70 | 63 |
| Total elongation (%) | 10 | 9 |
| Electric conductivity (%) (IACS) | 42 | 31 |

EXAMPLE 5

The sample alloy J having a composition within the scope of the present invention, as shown in Table 4, was annealed at 750° C. for 30 minutes after cold-rolling, and then subjected to the aging treatment at 490° C. for 180 minutes. Then, the sample was finally cold-rolled at a reduction ratio of 25%. The material properties of the so-obtained sample and a sample not subjected to the final cold-rolling treatment are shown in Table 8. It can be seen that the final cold-rolling treatment effectively increases the strength without a substantial reduction of the electric conductivity.

TABLE 8

| | Sample 18 | Sample 19 |
|---|---|---|
| Reduction ratio (%) at final cold-rolling | 25 | 0 |
| | present invention | present invention |
| Tensile strength (kgf/mm²) | 67 | 62 |
| Total elongation (%) | 9 | 13 |
| Electric conductivity (%) (IACS) | 51 | 53 |

EXAMPLE 6

The grain size numbers and material properties of iron/copper/chromium alloy wires obtained from sample alloys A, B, and C shown in Table 2, under the conditions described below, are shown in Table 9. Namely, samples 20 through 24 were prepared by continuously casting the starting alloy into a wire having a diameter of 10 mm at a cooling speed of $1.5 \times 10^{2}$° C./sec by using a horizontal CC casting machine, cooling the wire at a cooling speed of 15° C./sec within a temperature range of from 850° to 750° C. by a heat reserving furnace, cold-rolling the wire so that the final diameter was 0.25, and carrying out the aging treatment at 500° C. for 150 minutes, followed by air cooling.

The corrosion resistance was evaluated based on the ratio (%) of rust spots observed after the salt water spray test was conducted according to JIS Z-2371.

For comparison, the characteristics of the Cu/Fe/Sn alloy are shown in Table 9.

It can be seen that sample 19 having a too low chromium content is inferior in corrosion resistance, when evaluated by the salt water spray test. It also can be seen that samples 21 and 23 having a larger grain size than samples 20 and 22 of the present invention having the same composition are inferior to the samples of the present invention in tensile strength, electric conductivity, soldering property, and Cu-plating property. Accordingly, it is obvious that the materials of the present invention have superior properties.

TABLE 9

| Sample No. | Sample Alloy | | Grain Size Number (ASTM) | Tensile Strength (kgf/mm²) | Total Elongation (%) | Electric Conductivity (IACS) (%) | Salt Water Spray Test (%) | Soldering Property | | Evaluation of Cu-Plating Property |
|---|---|---|---|---|---|---|---|---|---|---|
| | | | | | | | | Wetting stress (g) | Evaluation | |
| 19 | A | comparison | 12.6 | 56 | 13 | 38 | 80 | 0.58 | good | good |
| 20 | B | present invention | 13.2 | 62 | 11 | 33 | 26 | 0.59 | good | good |
| 21 | B | comparison | 8.8 | 54 | 10 | 30 | 25 | 0.26 | bad | bad |
| 22 | C | present invention | 13.3 | 69 | 10 | 34 | 20 | 0.60 | good | good |
| 23 | C | comparison | 9.5 | 57 | 12 | 32 | 16 | 0.23 | bad | bad |
| Cu—0.1Fe2.0Sn | | comparison | — | 55 | 11 | 35 | — | 0.60 | good | good |

As is apparent from the foregoing description, according to the present invention, by utilizing a continuously cast thin piece for the production of an iron/copper/chromium alloy material for a high-strength lead frame or pin grid array, a material excellent in not only strength but also heat conductivity and electric conductivity can be obtained. Namely, according to the present invention, a material that can be used in place of a conventional Fe/Ni alloy, a conventional copper alloy for a high-strength lead frame, or a conventional copper alloy for a grid array, can be obtained at a low cost.

We claim:

1. A process for the preparation of an iron/copper/chromium alloy material for a high-strength lead frame or pin grid array, which consist essentially of continuously casting a thin cast piece of an iron/copper/chromium alloy comprising 20 to 90% by weight of Cu and 2.5 to 12% by weight of Cr, with the balance being Fe and unavoidable impurities, at a cooling speed of at least 100° C./sec, cold-working the cast piece and subjecting the cast piece to an aging treatment at a temperature of 450° to 650° C. for 20 to 500 minutes.

2. A process according to claim 1, wherein the cast piece further contains at least one element selected from the group consisting of Si, Al, Ti, Ni, Zn, Sn, Nb, Zr and P, the amount of Al, Ti, Nb, Zr or P being from 0.01% to 0.5% by weight, the amount of Zn or Si being from 0.01% to 1% by weight and the amount of Ni or Sn being from 0.01% to 4% by weight.

3. A process according to claim 1, wherein each of the iron/chromium phase and copper phase of the cast piece has a grain size number of at least 10 on average.

4. A process according to claim 1, wherein after the cold-working, annealing is carried out at 650° to 1050° C. for 5 to 60 minutes.

5. A process according to claim 4, wherein after the aging treatment, final cold-working is carried out at a reduction ratio of 15 to 60%.

6. A process according to claim 2, wherein each of the iron/chromium phase and copper phase of the cast piece has a grain size number of at least 10 on average.

7. A process according to claim 1, wherein after the aging treatment, final cold-working is carried out at a reduction ratio of 15 to 60%.

* * * * *